(12) United States Patent
Alptekin et al.

(10) Patent No.: US 8,815,693 B2
(45) Date of Patent: Aug. 26, 2014

(54) FINFET DEVICE FORMATION

(71) Applicant: International Business Machines Corporation, Armonk, NY (US)

(72) Inventors: Emre Alptekin, Wappingers Falls, NY (US); Ravikumar Ramachandran, Pleasantville, NY (US); Viraj Y. Sardesai, Poughkeepsie, NY (US); Reinaldo A. Vega, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/747,683

(22) Filed: Jan. 23, 2013

(65) Prior Publication Data

US 2014/0203371 A1  Jul. 24, 2014

(51) Int. Cl.
*H01L 21/336* (2006.01)
*H01L 21/4763* (2006.01)

(52) U.S. Cl.
USPC .......................... 438/295; 438/296; 438/595

(58) Field of Classification Search
USPC .......................................... 438/295, 296, 595
See application file for complete search history.

(56) References Cited

U.S. PATENT DOCUMENTS

| | | | |
|---|---|---|---|
| 5,838,026 A | 11/1998 | Kitagawa et al. | |
| 6,445,042 B1 | 9/2002 | Yu et al. | |
| 7,018,891 B2 | 3/2006 | Doris et al. | |
| 7,488,650 B2 | 2/2009 | Schulz | |
| 7,566,619 B2 | 7/2009 | Ahn et al. | |
| 8,148,772 B2 | 4/2012 | Doyle et al. | |
| 8,236,634 B1 | 8/2012 | Kanike et al. | |
| 8,236,637 B2 | 8/2012 | Utomo et al. | |
| 8,691,652 B2 * | 4/2014 | Kuo et al. | 438/283 |
| 2008/0157172 A1* | 7/2008 | Lee | 257/321 |
| 2012/0091528 A1* | 4/2012 | Chang et al. | 257/347 |
| 2012/0241857 A1* | 9/2012 | Anderson et al. | 257/331 |
| 2013/0237026 A1* | 9/2013 | Lee et al. | 438/283 |
| 2014/0061793 A1* | 3/2014 | Pei et al. | 257/347 |
| 2014/0065782 A1* | 3/2014 | Lu et al. | 438/294 |
| 2014/0080275 A1* | 3/2014 | Harley et al. | 438/283 |

FOREIGN PATENT DOCUMENTS

JP  2001110818 A  4/2001

OTHER PUBLICATIONS

Choi et al., "Sub-20nm CMOS FinFET Technologies", Department of Electrical Engineering and Computer Sciences, University of California, Berkeley, CA; IEDM01-421 through 424 IEDM 01; Dec. 2-5, 2001; IEEE, pp. 19.1.1-19.1.4.
Ramadout et al., "Multigate MOSFET in a Bulk Technology by Integrating Polysilicon-Filled Trenches", IEEE Electron Device Letters, vol. 30, No. 12, Dec. 2009, pp. 1350-1352.
Vega et al., Low-Standby-Power Bulk MOSFET Design Using High-k Trench Isolation, IEEE Electron Device Letters, vol. 30, No. 12, Dec. 2009, pp. 1380-1382.
Reinaldo et al., "Comparative Study of FinFET Versus Quasi-Planar HTI-MOSFET for Ultimate Scalability", IEEE Transactions on Electron Devices, vol. 57, No. 12, Dec. 2010, pp. 3250-3256.

* cited by examiner

*Primary Examiner* — Ngan Ngo
(74) *Attorney, Agent, or Firm* — Cantor Colburn LLP; Joseph Abate

(57) ABSTRACT

A method includes patterning a fin on a semiconductor substrate, depositing a local trench isolation (LTI) layer on the semiconductor substrate, patterning a gate stack over a channel region of the fin and over a portion of the LTI layer, depositing a first capping layer over exposed portions of the LTI layer, performing an etching process to remove oxide material from exposed portions of the fin, and epitaxially growing a semiconductor material from exposed portions of the fin to define active regions.

17 Claims, 12 Drawing Sheets

FINFET DEVICE FORMATION

BACKGROUND

The present invention relates to field effect transistor (FET) devices, and more specifically, to FinFET devices.

FinFET devices include a semiconductor fin that is arranged on a substrate. A gate stack is arranged over a channel region of the fin. The fin partially defines source and drain regions of the device. Though some FinFET devices are formed on semiconductor-on-insulator (SOI) substrates, other FinFETs may be formed on a bulk semiconductor substrate. In this regard, the fin is patterned on the bulk semiconductor substrate by removing portions of the bulk semiconductor substrate. Following the patterning of the fin, a local trench isolation (LTI) region is formed on a portion of the substrate adjacent to the fin. The gate stack may be formed on the LTI region.

SUMMARY

According to an exemplary embodiment of the present invention, a method includes patterning a fin on a semiconductor substrate, depositing a local trench isolation (LTI) layer on the semiconductor substrate, patterning a gate stack over a channel region of the fin and over a portion of the LTI layer, depositing a first capping layer over exposed portions of the LTI layer, performing an etching process to remove oxide material from exposed portions of the fin, and epitaxially growing a semiconductor material from exposed portions of the fin to define active regions.

According to another exemplary embodiment of the present invention, a method includes patterning a fin on a semiconductor substrate, depositing a local trench isolation (LTI) layer on the semiconductor substrate, patterning a dummy gate stack over a channel region of the fin and over a portion of the LTI layer, forming spacers adjacent to the dummy gate stack, depositing a first capping layer over exposed portions of the LTI layer, performing an etching process to remove oxide material from exposed portions of the fin, epitaxially growing a semiconductor material from exposed portions of the fin to define active regions, removing the dummy gate stack to expose the channel region of the fin and a portion of the LTI layer, and forming a gate stack over the channel region of the fin and the exposed portion of the LTI layer.

According to yet another exemplary embodiment of the present invention, a device includes a semiconductor substrate, a semiconductor fin arranged on the substrate, a local trench isolation (LTI) layer disposed on the substrate, a gate stack disposed over a channel region of the fin and a portion of the LTI layer, a first capping layer disposed on a portion of the LTI layer, and an epitaxially grown semiconductor material arranged on the fin and the first capping layer, the epitaxially grown semiconductor material partially defining active regions of the device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As discussed above, in the fabrication of FinFET devices, following the patterning of the fin, a local trench isolation (LTI) region is formed from an oxide material on a portion of the substrate adjacent to the fin. The a gate stack may be formed on the LTI region. Epitaxially grown semiconductor material is formed to define source and drain regions that are grown from exposed portions of the fin. Prior to the epitaxial growth process, a cleaning process that includes an etching process that is selective to remove oxide materials is performed to remove oxide contaminants from the fin. The etching process may remove exposed portions of the LTI region, which reduces the thickness of the exposed LTI region below the source and drain regions. The reduction in the thickness of the LTI region is undesirable since the gate stack that was formed over the channel region of the fin and over a portion of the LTI region will have a bottom surface (arranged on the LTI region) that is over a relatively thicker portion of the LTI region than the thinner portion of the LTI region that is below the source and drain regions. Such an arrangement results in a gate stack that is arranged above the lowest portion of the source and drain regions. The arrangement is undesirable due to increased short channel effects in the FinFET device. The methods and resultant structures described below provide for a FinFET device having source and drain regions with bottom surfaces that are above the bottom surface of the gate stack.

Figure 1A:
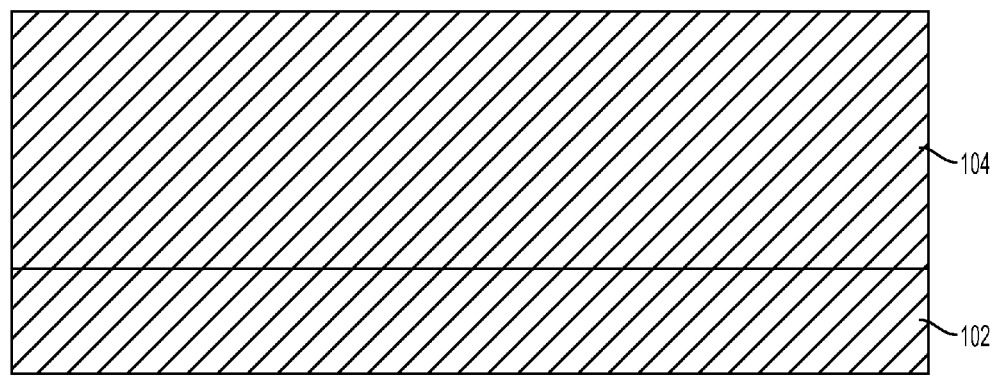
FIG. 1A illustrates a side view and FIG. 1B illustrates a front view of a bulk substrate and a fin.
Figure 1B:
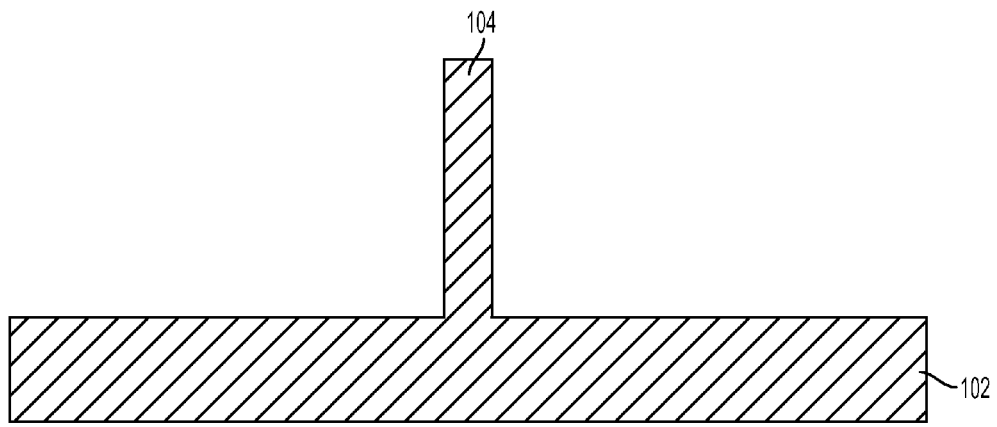

In this regard, FIG. 1A illustrates a side view and FIG. 1B illustrates a front view of a bulk substrate 102 and a fin 104 that has been patterned from the bulk substrate 102. The bulk substrate 102 and the fin 104 include a semiconductor material such as, for example, a silicon or germanium material. The fin 104 may be patterned by, for example, a suitable photolithographic patterning and etching process such as, reactive ion etching (RIE).

Figure 2A:
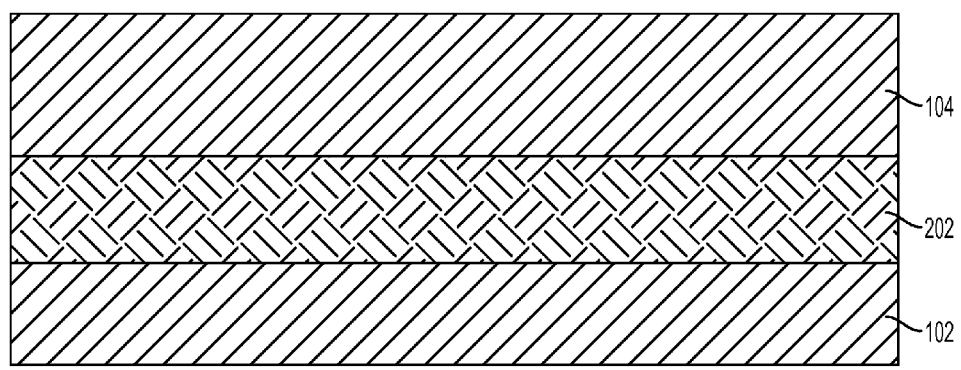
FIG. 2A illustrates a side view and FIG. 2B illustrates a front view of the formation of a LTI layer.
Figure 2B:
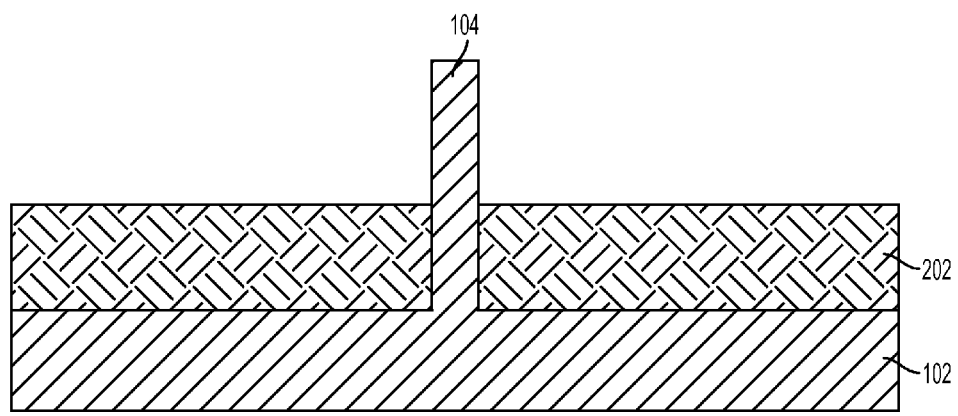

FIG. 2A illustrates a side view and FIG. 2B illustrates a front view of the formation of a LTI layer 202 on exposed portions of the bulk substrate 102. The LTI layer 202 may include, for example, an oxide material. The LTI layer 202 may be formed by, for example, depositing a layer of oxide material over exposed portions of the bulk substrate 102 and the fin 104. A planarization process such as, for example chemical mechanical polishing (CMP) may be performed to remove portions of the LTI layer 202 and expose a top portion of the fin 104. An etching process such as, for example, a wet etching process that is selective to the LTI layer 202 material may then be performed to remove additional portions of the LTI layer 202 to further expose sidewall portions of the fin 104 and result in an LTI layer 202 having a desired thickness, as particularly shown in FIG. 2B.

Figure 3A:
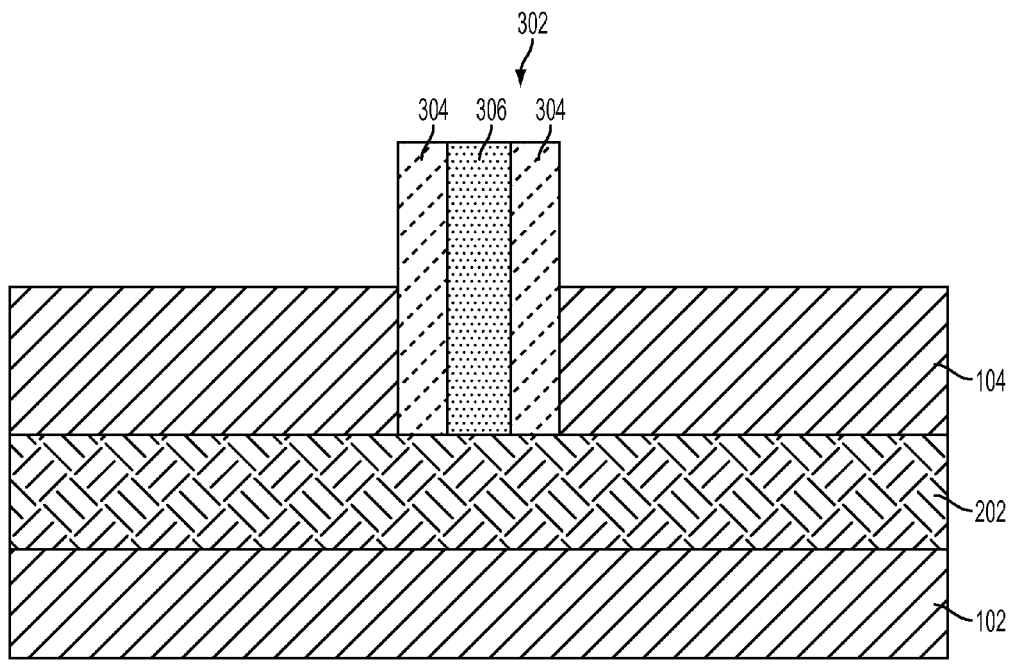
FIG. 3A illustrates a side view and FIG. 3B illustrates a front view of the formation of a dummy gate stack.
Figure 3B:
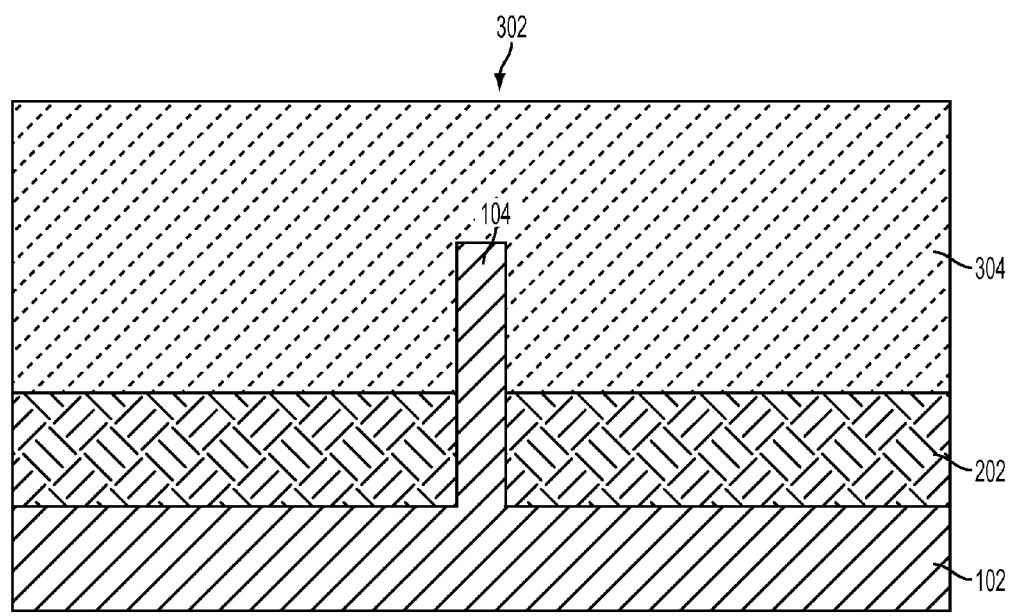

FIG. 3A illustrates a side view and FIG. 3B illustrates a front view of the formation of a dummy gate stack 302 over a channel region of the fin and spacers 304 adjacent to the dummy gate stack 302. Though the illustrated embodiments described herein include the formation of the dummy gate stack 302, alternate embodiments may form a gate stack having a dielectric layer and a gate metal layer following the formation of the LTI layer 202. The dummy gate stack 302 may be formed by, for example, depositing a layer of dielectric material (not shown) such as, an oxide material and a dummy gate material such as, for example, a polysilicon material over the exposed portions of the fin 104 and the LTI layer 202. A lithographic patterning and etching process is performed to remove portions of the dielectric material and the dummy gate material to expose portions of the fin 104 and the LTI layer 202 and pattern the dummy gate 306. A layer of spacer material such as, for example, a nitride material is formed over the exposed portions of the dummy gate 306, the fin 104, and the LTI layer 202. The spacer material is etched to expose portions of the fin 104, the LTI layer 202, and the dummy gate 306 to define the spacers 304 arranged adjacent to the dummy gate 306.

Figure 4A:
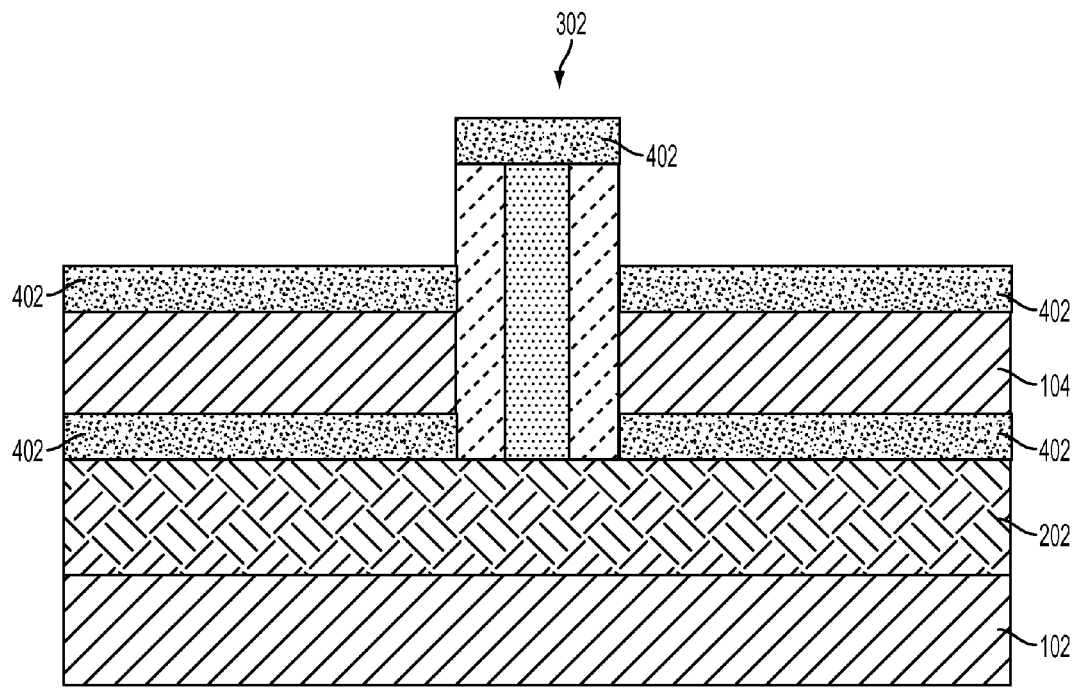
FIG. 4A illustrates a side view and FIG. 4B illustrates a front view of a capping layer.
Figure 4B:
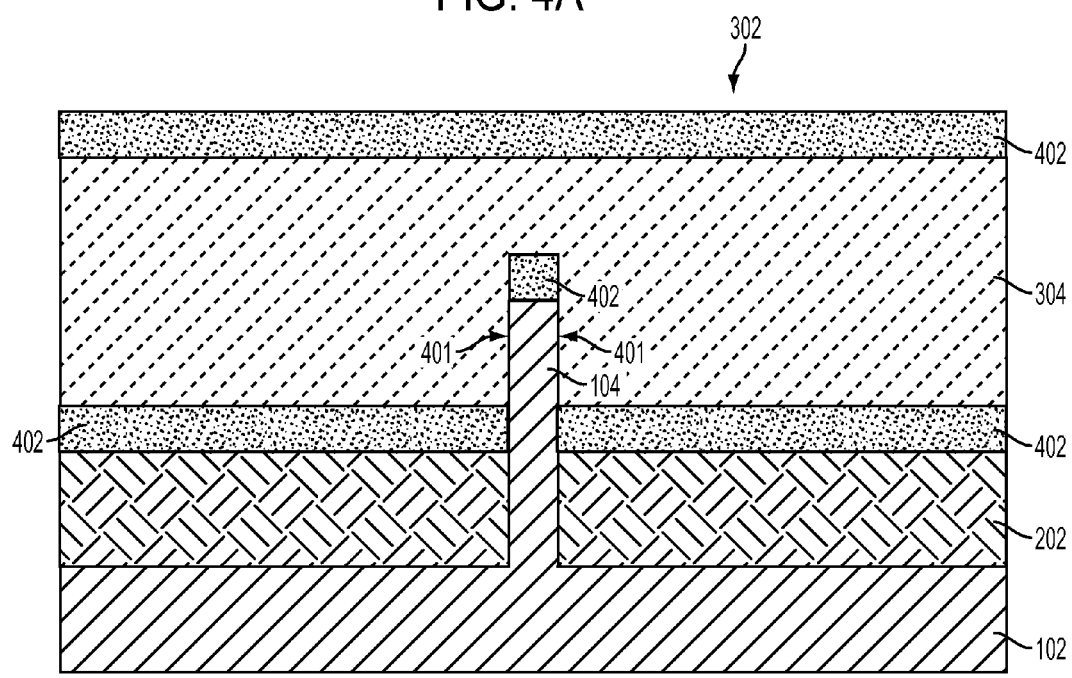

FIG. 4A illustrates a side view and FIG. 4B illustrates a front view of a capping layer 402 that is formed over the exposed substantially horizontal surfaces of the LTI layer 202, the fin 104, and the dummy gate stack 302. The capping layer 402 may include, for example, a nitride material that is deposited using a high density plasma (HDP) or a gas cluster ion beam (GCIB) process that effectively deposits the majority of the capping layer 402 on the horizontal surfaces without depositing a substantial or appreciable amount of capping layer 402 material on the sidewalls of the fin 104 or the spacers 304.

Figure 5A:
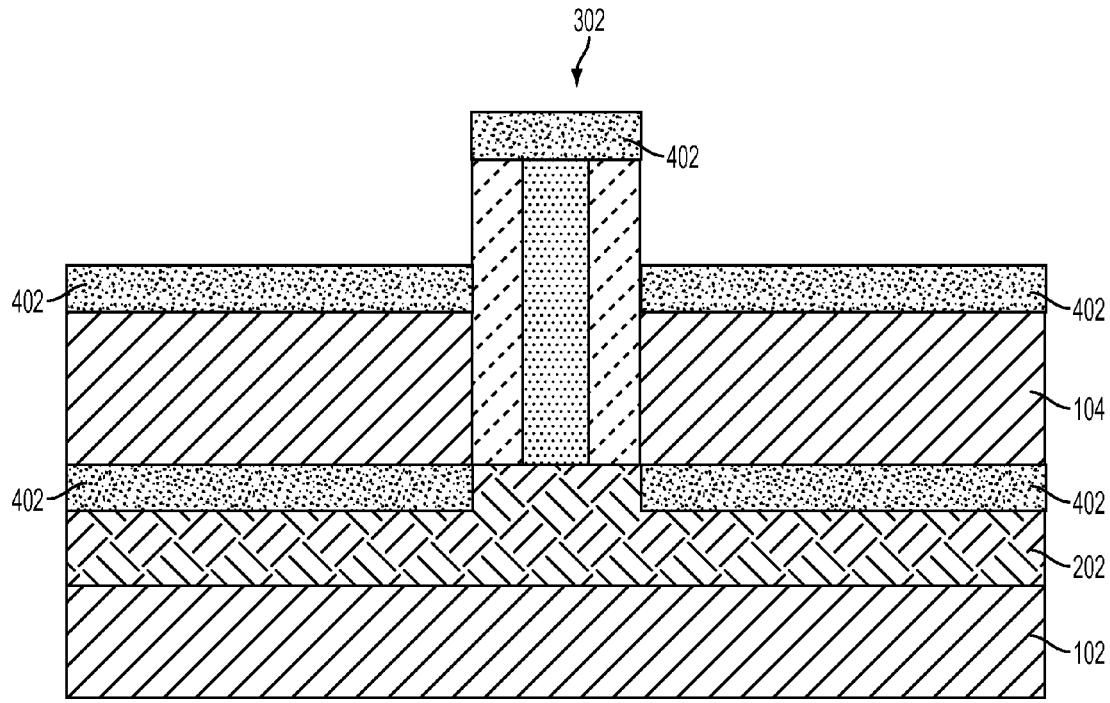
FIG. 5A illustrates a side view and FIG. 5B illustrates a front view of an alternate exemplary method.
Figure 5B:
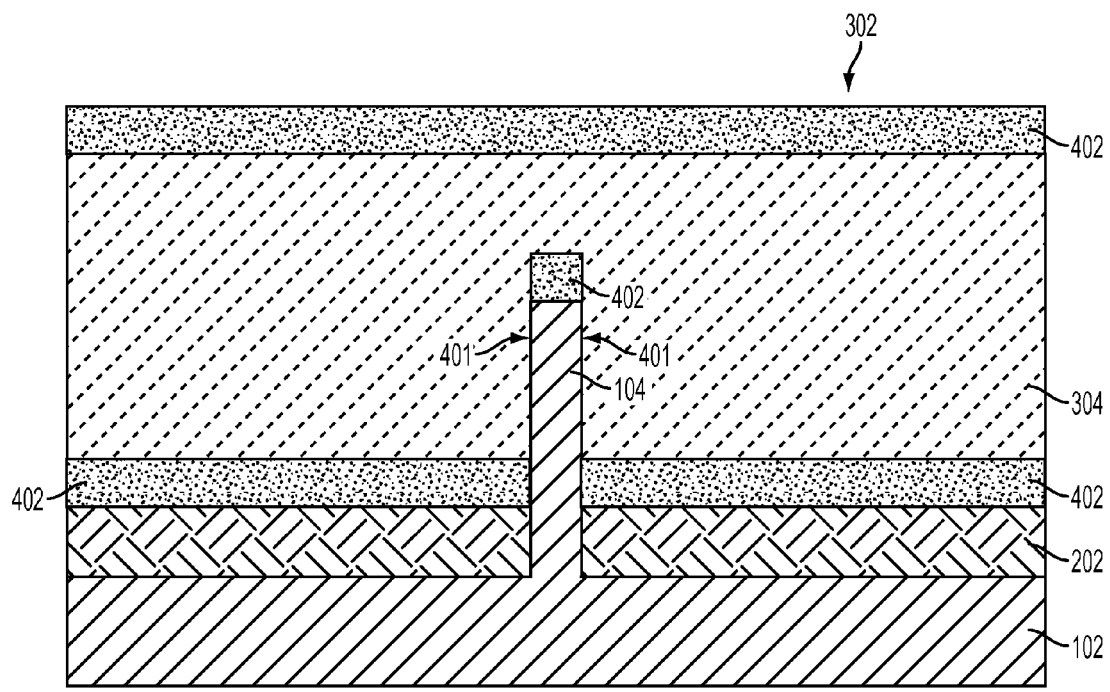

FIG. 5A illustrates a side view and FIG. 5B illustrates a front view of an alternate exemplary method that may be included in the methods described herein. In this regard, prior to the formation of the capping layer 402, an etching process that is selective to the LTI layer 202 may be performed to remove exposed portions of the LTI layer 202. The etching process reduces the thickness of the LTI layer 202 adjacent to the dummy gate stack 302. Following the removal of portions of the LTI layer 202, the capping layer 402 may be deposited in a similar manner as discussed above.

Figure 6A:
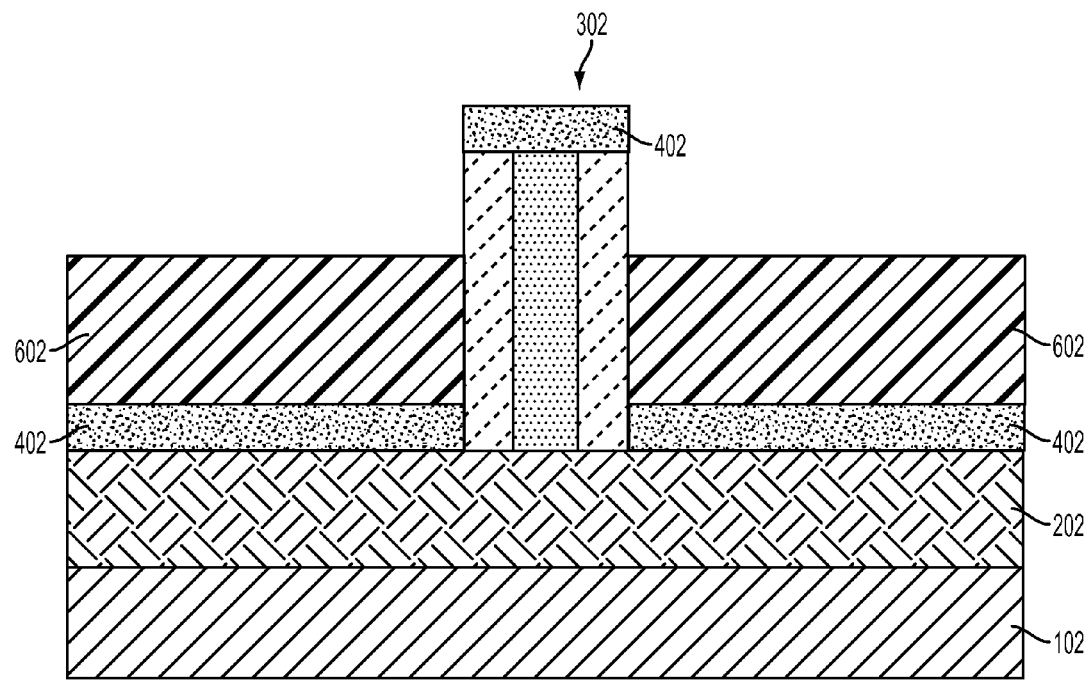
FIG. 6A illustrates a side view and FIG. 6B illustrates a front view of the arrangement described in FIGS. 4A and 4B following the epitaxial growth of a semiconductor material.
Figure 6B:
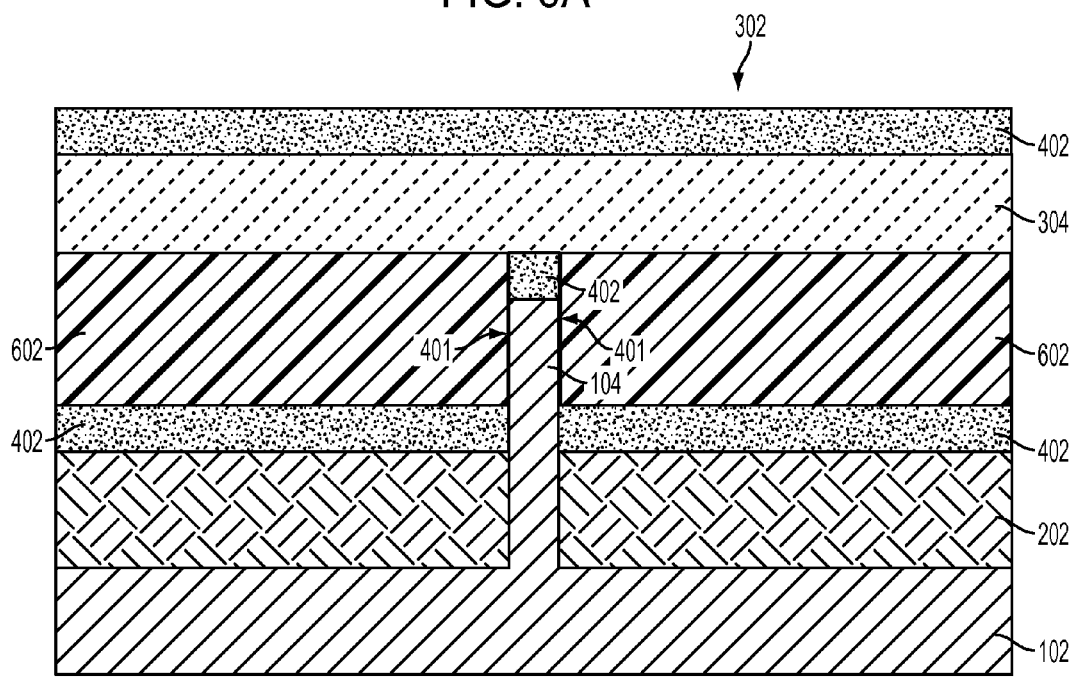

FIG. 6A illustrates a side view and FIG. 6B illustrates a front view of the arrangement described above in FIGS. 4A and 4B following the epitaxial growth of a semiconductor material that forms source and drain regions (active regions) 602. In this regard, a cleaning or etching process is performed that is selective to remove oxide materials from the exposed portions of the fins 104. The etching process does not appreciably remove the capping layer 402, and portions of the capping layer 404 protect the underlying LTI layer 202 such that the LTI layer 202 remains intact.

In some embodiments, a thin layer of the capping layer 402 material may be present on the side walls 401 of the fins 104. In this regard, the cleaning or etching process may remove some of the capping layer 402 material to expose the sidewalls 401 of the fins 104. The etching process may remove other exposed portions of the capping layer 402; however, the horizontal surfaces of the capping layer 402 are thicker than the capping layer material 402 that may be disposed on the sidewalls 401 of the fins 104. Thus, the etching process may not fully remove the portions of the capping layer material 402 that protect the LTI layer 202.

Following the cleaning process, the epitaxial growth process is performed. The active regions 602 may be doped with dopants in a variety of processes. For example, the active regions may be doped using an ion implantation process or doped in-situ during the epitaxial growth process. Alternatively, in some exemplary embodiments, a combination of in-situ doped epitaxy followed by ion implantation may be used to dope the active regions 602.

Figure 7A:
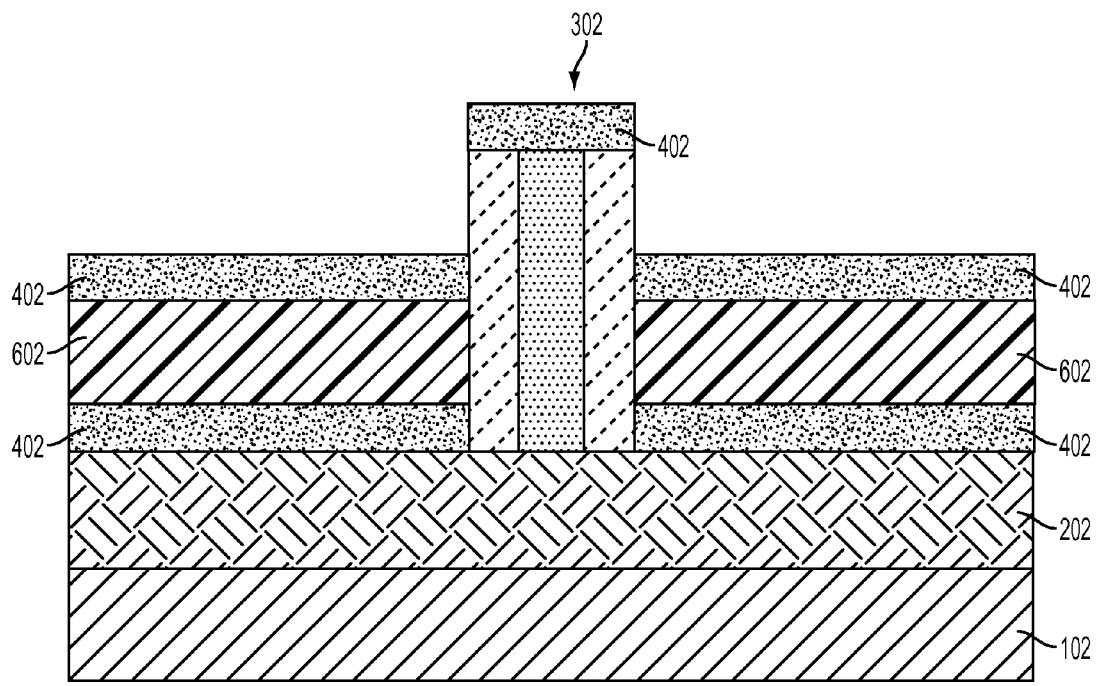
FIG. 7A illustrates a side view and FIG. 7B illustrates a front view of an exemplary process that may be optionally performed in some exemplary embodiments.
Figure 7B:
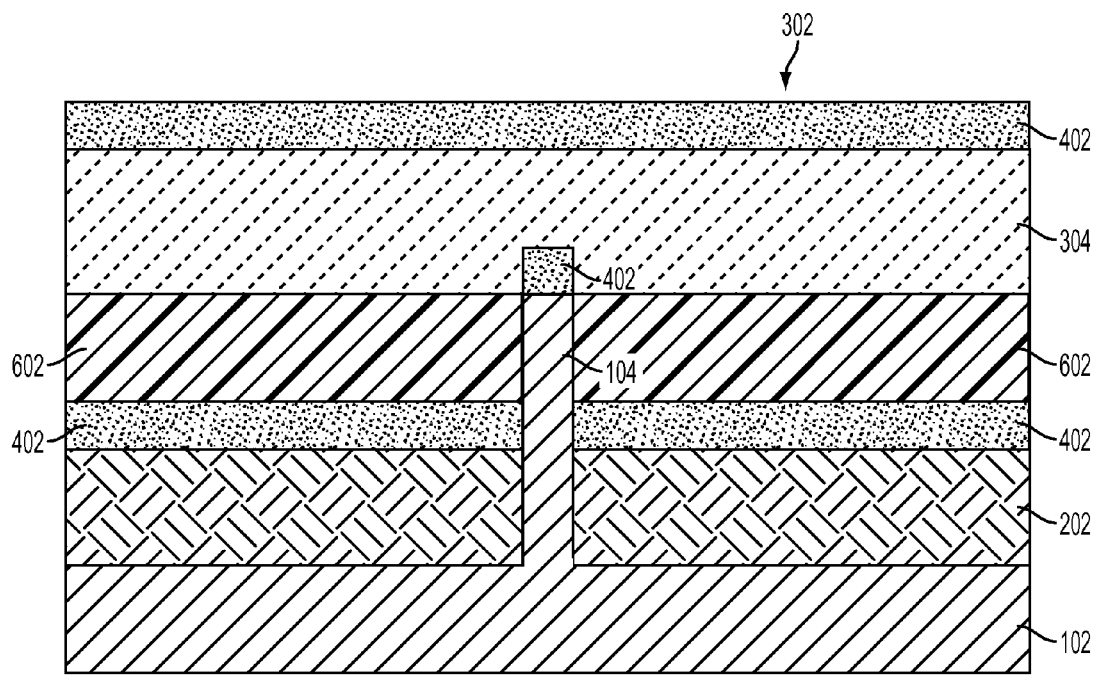

FIG. 7A illustrates a side view and FIG. 7B illustrates a front view of an exemplary process that may be optionally performed in some exemplary embodiments. In this regard, a selective etching process may be performed to remove exposed portions of the active regions 602 to reduce the thickness of the active regions 602 and further expose a portion of the capping layer 402 arranged on the fin 104.

Figure 8A:
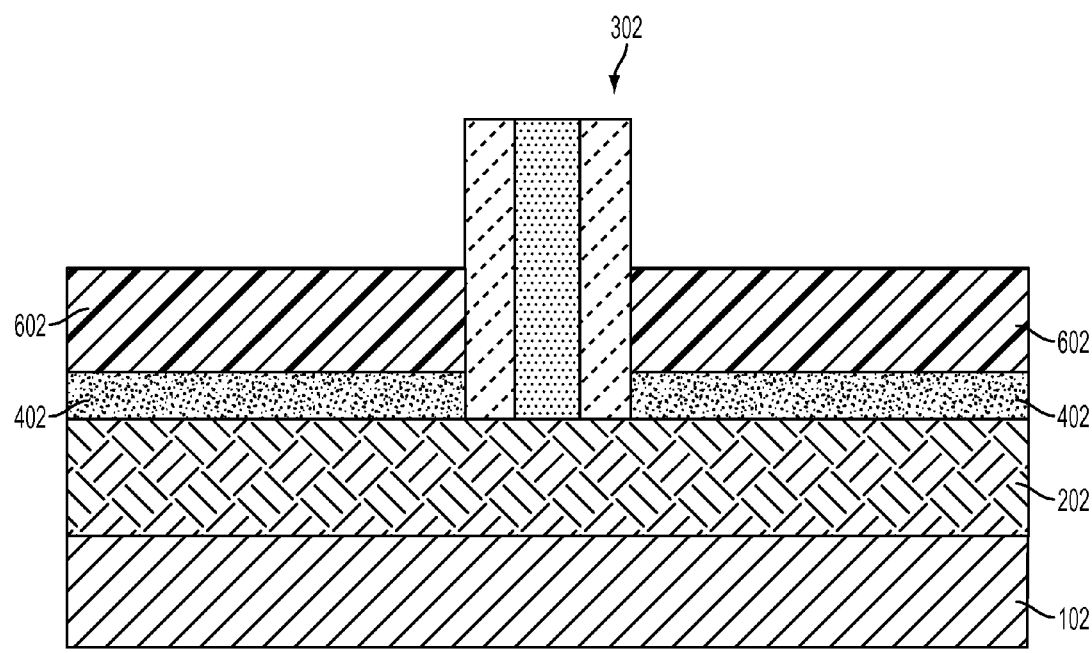
FIG. 8A illustrates a side view and FIG. 8B illustrates a front view of the resultant arrangement following the removal of exposed portions of the capping layer.
Figure 8B:
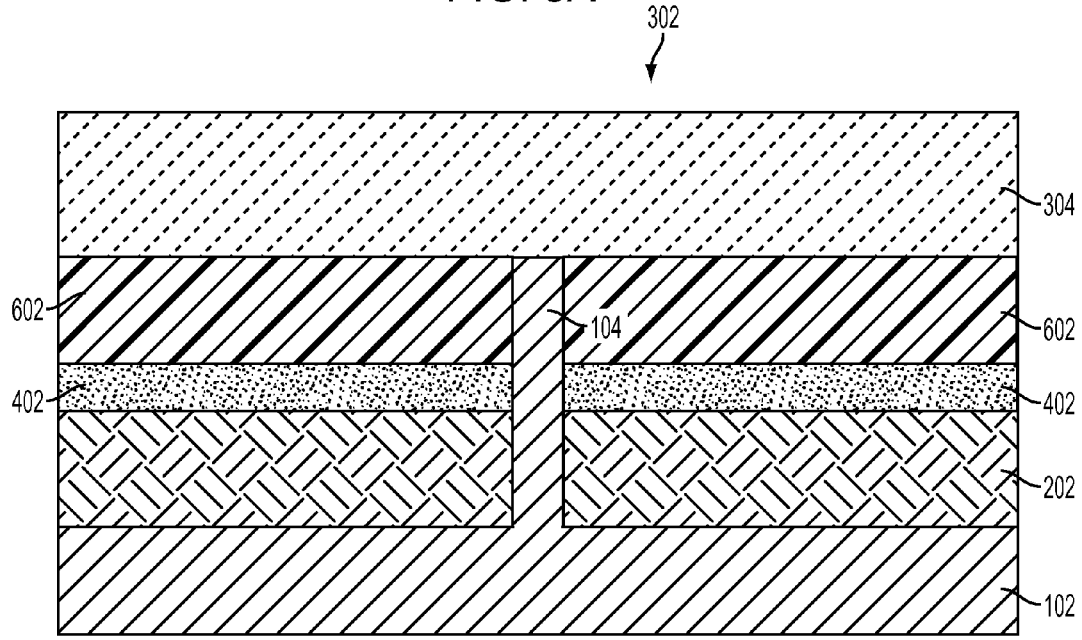

FIG. 8A illustrates a side view and FIG. 8B illustrates a front view of the resultant arrangement following the removal of exposed portions of the capping layer 402. A suitable selective etching process may be performed to expose a portion of the fin 104 and the dummy gate stack 302. The processes described in FIGS. 7A and 7B and FIGS. 8A and 8B are optional, and may be incorporated into the exemplary method described herein if removing the portion of the capping layer 402 arranged on the fin 104 is desired.

Figure 9A:
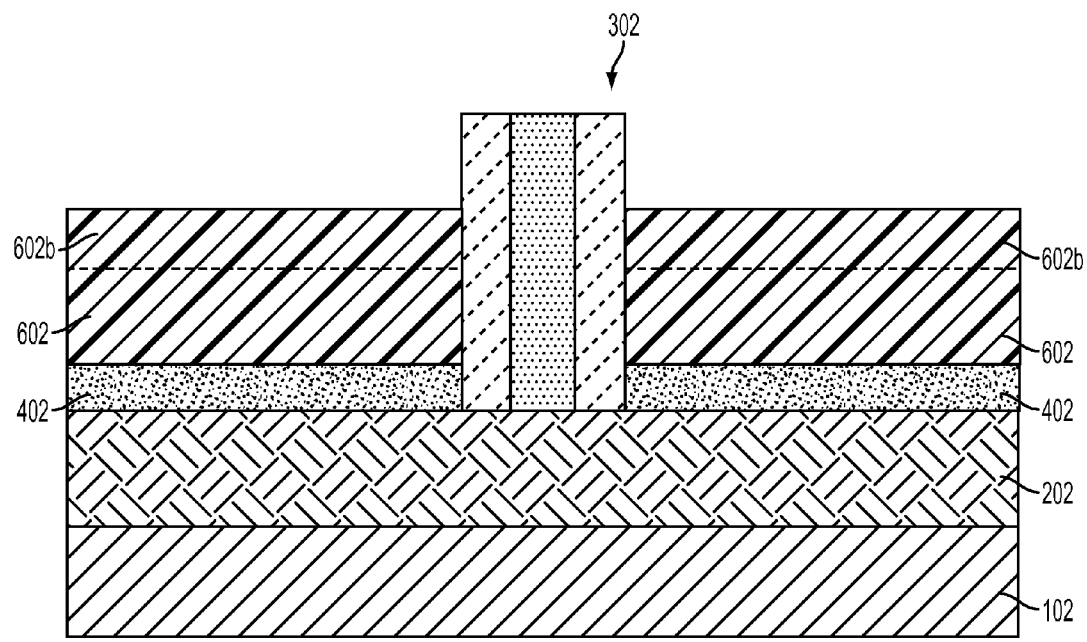
FIG. 9A illustrates a side view and FIG. 9B illustrates a front view of the resultant structure following an epitaxial growth process.
Figure 9B:
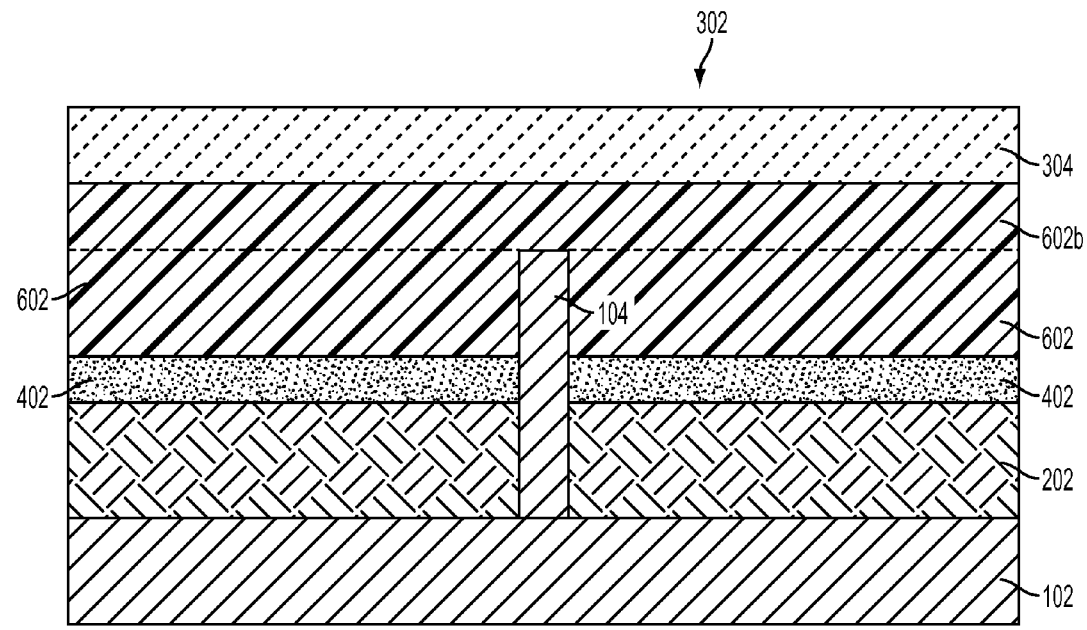

FIG. 9A illustrates a side view and FIG. 9B illustrates a front view of the resultant structure following an epitaxial growth process that grows a semiconductor material 602b from exposed portions of the active regions 602 and the fin 104. The material 602b may be doped or undoped material.

Figure 10A:
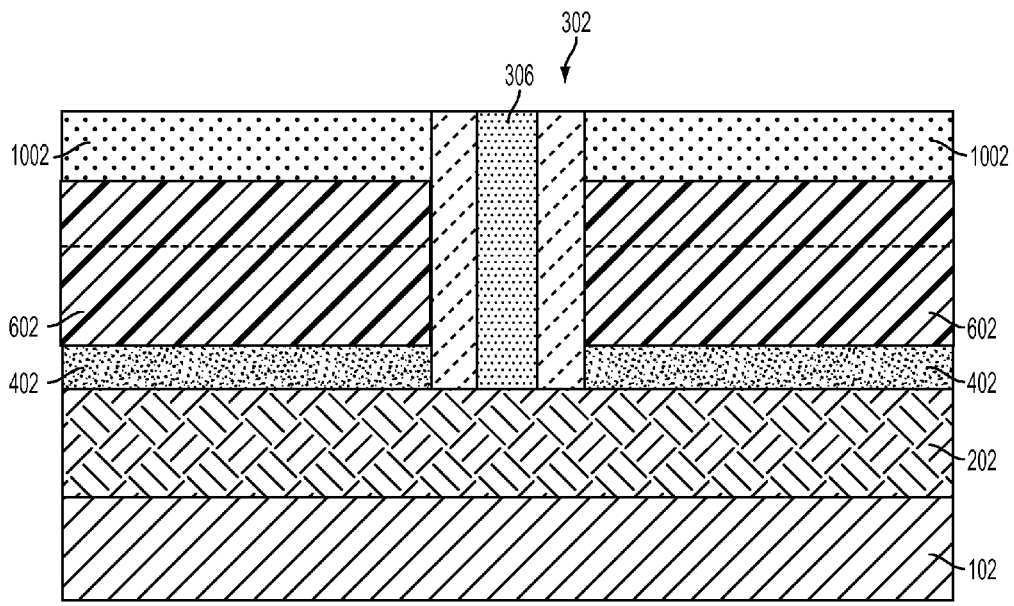
FIG. 10A illustrates a side view and FIG. 10B illustrates a front view of the formation of a capping layer.
Figure 10B:
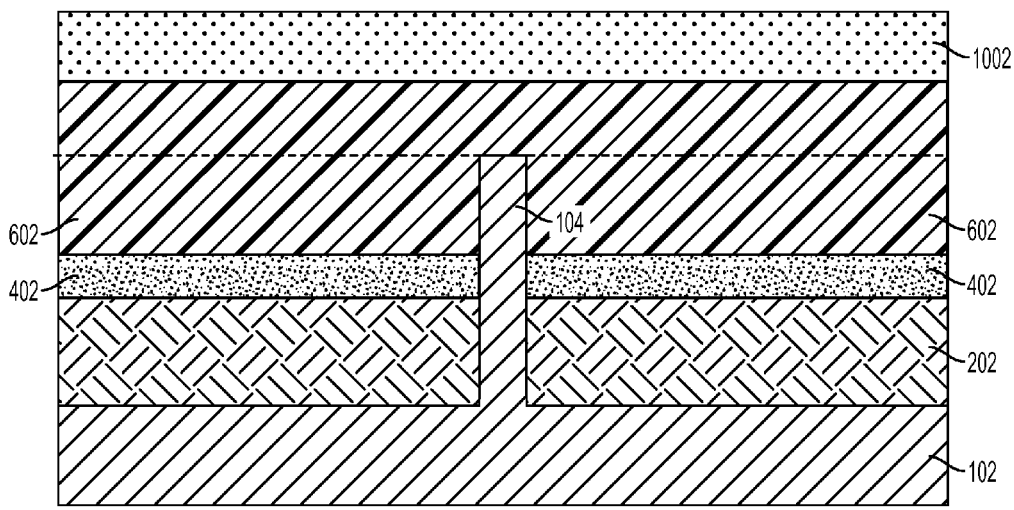

FIG. 10A illustrates a side view and FIG. 10B illustrates a front view of the formation of a capping layer 1002 over exposed portions of the active regions 602. The capping layer 1002 may include, for example, a plurality of layers of dielectric materials or a single layer of dielectric materials. In the illustrated embodiment the exposed surface of the capping layer 1002 includes a nitride material. The capping layer 1002 may be formed by, for example, a suitable material deposition process(s) followed by a planarization process that exposes the dummy gate stack 302.

Figure 11:
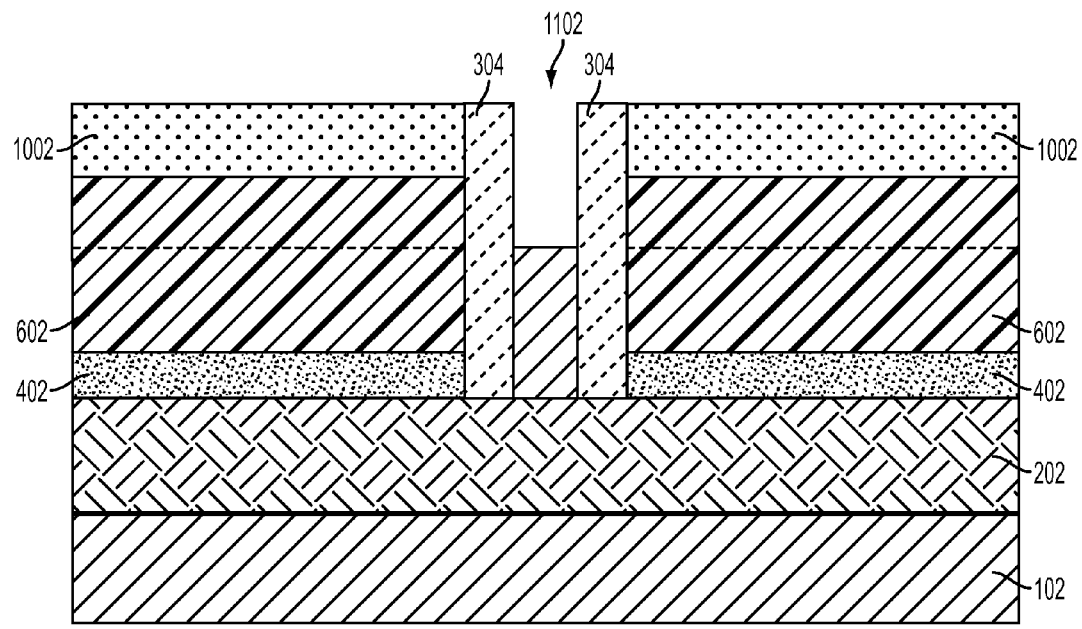
FIG. 11 illustrates a side view of the resultant structure following the removal of the dummy gate stack.

FIG. 11 illustrates a side view of the resultant structure following the removal of the dummy gate stack 306 (of FIG. 10A). The removal of the dummy gate stack 306 results in a cavity 1102 that exposes a channel region of the fin 104 and a portion of the LTI layer 202. The cavity is defined by the spacers 304, the fin 104, and the LTI layer 202.

Figure 12:
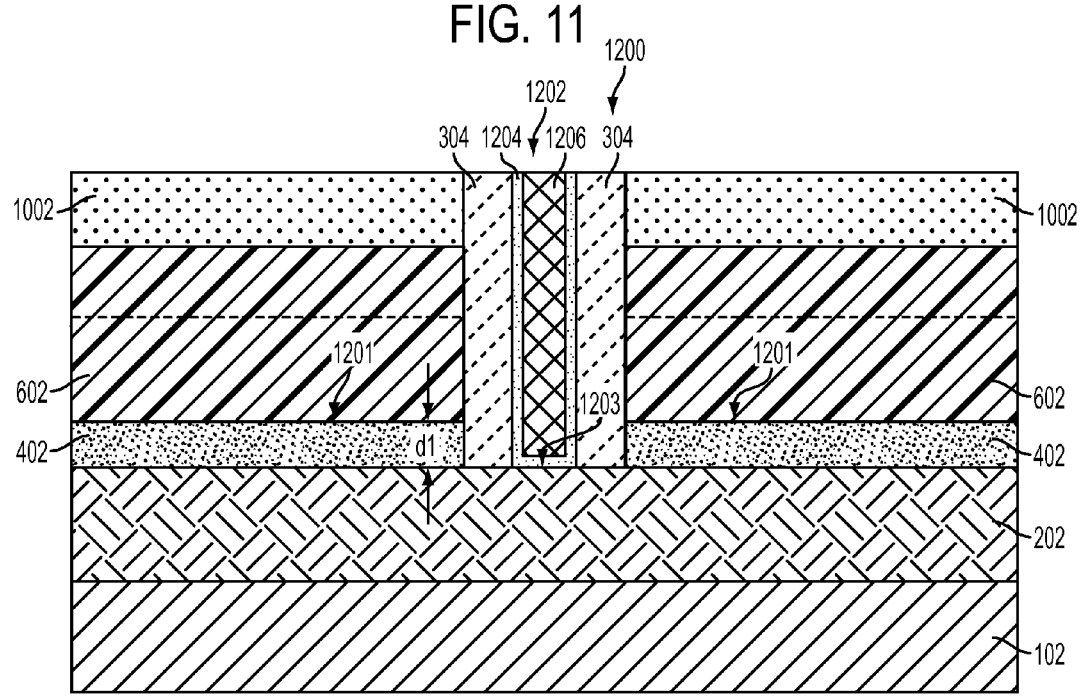
FIG. 12 illustrates a side view of an exemplary embodiment of the resultant FinFET device.

FIG. 12 illustrates a side view of an exemplary embodiment of the resultant FinFET device 1200 following the formation of a gate stack 1202 in the cavity 1102 (of FIG. 11). The gate stack 1202 includes a dielectric layer 1204 such as, for example, a high K dielectric material that is formed conformally over exposed portions of the fin 104 (of FIG. 11), exposed portions of the LTI layer 202, and sidewalls of the spacers 304. Following the deposition of the dielectric layer 1204, a gate metal material layer 1206 may be formed over the exposed portions of the dielectric layer 1204. A planarization process may be performed to define the gate stack 1202 and expose portions of the capping layer 1002. FIG. 12 illustrates a bottom surface 1201 of the active regions 602 that contacts the capping layer 402. The gate stack 1202 has a bottom surface 1203 that contacts the LTI layer 202. The surface 1201 and the surface 1203 substantially define planes that are substantially parallel and are spaced a distance (d1) that is approximately the thickness of the capping layer 402. The surface 1203 is below the surface 1201 (i.e., the surface 1203 is closer to the bulk substrate 102 than the surface 1201) such that the bottom of the active regions 602 are arranged above the bottom of the gate stack 1202. This arrangement increases the performance of the FinFET device 1200.

Figure 13:
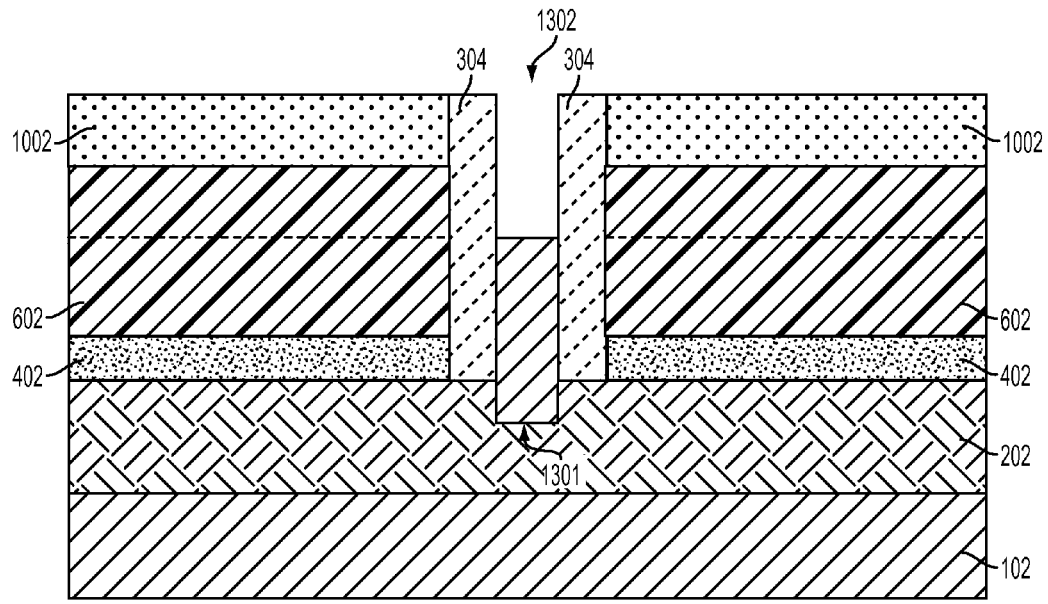
FIG. 13 illustrates a side view of an alternate resultant structure following the removal of the dummy gate stack.

FIG. 13 illustrates a side view of an alternate resultant structure following the removal of the dummy gate stack 306 (of FIG. 10A). The removal of the dummy gate stack 306 results in a cavity 1302 that exposes a channel region of the fin 104 and a portion of the LTI layer 202. The cavity is defined by the spacers 304, the fin 104, and the LTI layer 202. Following the removal of the dummy gate stack 306, a selective etching process such as, for example, an isotropic or anisotropic etching process is performed to remove exposed portions of the LTI layer 202 to increase the depth of the cavity 1302 by forming a recess 1301 in the LTI layer 202.

Figure 14:
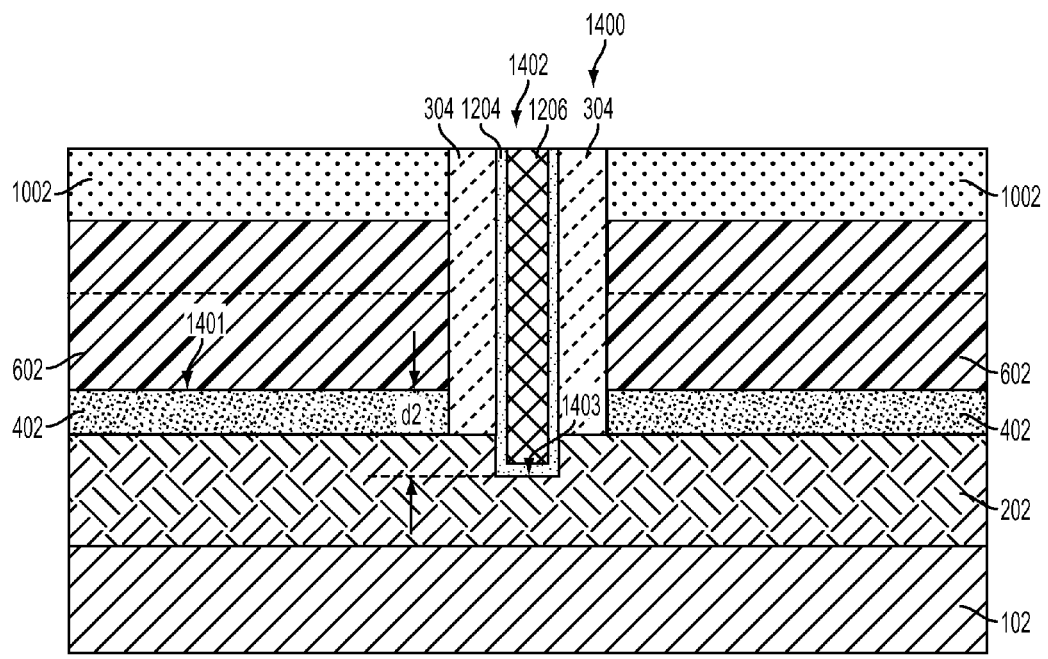
FIG. 14 illustrates a side view of an alternate exemplary embodiment of the resultant FinFET device.

FIG. 14 illustrates a side view of an alternate exemplary embodiment of the resultant FinFET device 1400 following the formation of a gate stack 1402 in the cavity 1302 using a similar process as described above. FIG. 14 illustrates a bottom surface 1401 of the active regions 602 that contacts the capping layer 402. The gate stack 1402 has a bottom surface 1403 that contacts the LTI layer 202. The surface 1401 and the surface 1403 substantially define planes that are substantially parallel and are spaced a distance (d2) that is approximately the thickness of the capping layer 402 and the depth of the recess 1301 (of FIG. 13). The surface 1403 is below the surface 1401 (i.e., the surface 1403 is closer to the bulk substrate 102 than the surface 1401) such that the bottom of the active regions 602 are arranged above the bottom of the gate stack 1402. This arrangement increases the performance of the FinFET device 1400.

The methods and resultant structures described herein provide for a FinFET device that has a gate stack arranged at a depth below the bottom of the active regions of the device. The exemplary arrangement provides a FinFET device with increased performance and yield.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method comprising:
 patterning a fin on a semiconductor substrate;
 depositing a local trench isolation (LTI) layer on the semiconductor substrate;
 patterning a gate stack over a channel region of the fin and over a portion of the LTI layer;
 depositing a first capping layer over exposed portions of the LTI layer;
 performing an etching process to remove oxide material from exposed portions of the fin; and
 epitaxially growing a semiconductor material from exposed portions of the fin to define active regions.

2. The method of claim 1, wherein the depositing the first capping layer does not appreciably dispose capping layer material on sidewalls of the fin.

3. The method of claim 1, wherein the depositing the first capping layer results in a first capping layer having a first thickness in regions of the first capping layer that are disposed above and in contact with the LTI layer and a second thickness in regions of the first capping layer that are disposed on sidewalls of the fin, wherein the first thickness is greater than the second thickness.

4. The method of claim 1, further comprising forming spacers adjacent to the gate stack prior to depositing the first capping layer.

5. The method of claim 1, wherein the LTI layer includes an oxide material.

6. The method of claim 1, wherein the first capping layer includes a nitride material.

7. The method of claim 1, further comprising removing exposed portions of the LTI layer to reduce the thickness of the LTI layer prior to depositing the first capping layer.

8. A method comprising:
 patterning a fin on a semiconductor substrate;
 depositing a local trench isolation (LTI) layer on the semiconductor substrate;
 patterning a dummy gate stack over a channel region of the fin and over a portion of the LTI layer;
 forming spacers adjacent to the dummy gate stack;
 depositing a first capping layer over exposed portions of the LTI layer;
 performing an etching process to remove oxide material from exposed portions of the fin;

epitaxially growing a semiconductor material from exposed portions of the fin to define active regions;

removing the dummy gate stack to expose the channel region of the fin and a portion of the LTI layer; and forming a gate stack over the channel region of the fin and the exposed portion of the LTI layer.

9. The method of claim 8, wherein the depositing the first capping layer does not appreciably dispose capping layer material on sidewalls of the fin.

10. The method of claim 8, wherein the depositing the first capping layer results in a first capping layer having a first thickness in regions of the first capping layer that are disposed above and in contact with the LTI layer and a second thickness in regions of the first capping layer that are disposed on sidewalls of the fin, wherein the first thickness is greater than the second thickness.

11. The method of claim 8, further comprising forming spacers adjacent to the gate stack prior to depositing the first capping layer.

12. The method of claim 8, wherein the LTI layer includes an oxide material.

13. The method of claim 8, wherein the first capping layer includes a nitride material.

14. The method of claim 8, further comprising removing exposed portions of the LTI layer to reduce the thickness of the LTI layer prior to depositing the first capping layer.

15. The method of claim 8, further comprising depositing a second capping layer over exposed portions of the active regions prior to removing the dummy gate stack.

16. The method of claim 15, wherein the second capping layer includes a nitride material.

17. The method of claim 8, further comprising removing exposed portions of the LTI layer to define a recess in the LTI layer prior to forming the gate stack.

* * * * *